United States Patent [19]

Weaver et al.

[11] Patent Number: 5,099,203

[45] Date of Patent: Mar. 24, 1992

[54] POWER AMPLIFIER HAVING MULTIPLE SWITCHED STAGES AND METHOD OF OPERATING SAME

[75] Inventors: Bryan A. Weaver; Daniel L. Dickey, Sr., both of Dallas, Tex.

[73] Assignee: Continental Electronics Corporation, Dallas, Tex.

[21] Appl. No.: 533,646

[22] Filed: Jun. 5, 1990

[51] Int. Cl.$^5$ .............................................. H03F 3/38
[52] U.S. Cl. .................................. 330/10; 330/207 A; 330/251
[58] Field of Search ...................... 330/10, 207 A, 251; 332/109, 110; 455/108

[56] References Cited

U.S. PATENT DOCUMENTS

| | | | |
|---|---|---|---|
| 3,506,920 | 4/1970 | Swanson | |
| 3,588,744 | 6/1971 | Swanson | 328/164 |
| 4,140,980 | 2/1979 | Cummings | 307/263 |
| 4,164,714 | 8/1979 | Swanson | 330/10 |
| 4,369,409 | 1/1983 | Kyrian et al. | 330/10 |
| 4,403,197 | 9/1983 | Swanson | 330/10 |
| 4,468,626 | 8/1984 | Swanson | 330/10 |
| 4,560,944 | 12/1985 | Furrer | 330/10 |
| 4,724,420 | 2/1988 | Woodard | 340/347 AD |
| 4,747,161 | 5/1988 | Hulsey et al. | 455/108 |
| 4,776,036 | 10/1988 | Hulsey et al. | 455/108 |
| 4,896,372 | 1/1990 | Weaver | 455/108 |

Primary Examiner—James B. Mullins
Attorney, Agent, or Firm—Lowe, Price LeBlanc & Becker

[57] ABSTRACT

A power amplifier for a plate load of an AM, RF transmitter includes plural switching stages each powered by a DC source. Each stage is switched from non-sourced to saturation in response to the amplitude of an analog source exceeding a threshold amplitude for the stage; each stage has a different threshold. The thresholds and analog source are arranged so that responses derived between output terminals of the stages change between zero and predetermined amplitudes as the source amplitude changes relative to the thresholds of the different stages. The responses of the different stages are summed. A triangular wave having a small constant maximum amplitude relative to the analog source maximum value effectively changes the threshold of each stage. From time to time the thresholds of different stages are changed so that at different times different stages are in non-sourced and conducting for the same amplitude of the modulating source, while providing the same summed response for the same amplitude of the modulating source.

134 Claims, 3 Drawing Sheets

POWER AMPLIFIER HAVING MULTIPLE SWITCHED STAGES AND METHOD OF OPERATING SAME

FIELD OF THE INVENTION

The present invention relates generally to power amplifiers particularly adapted to provide modulation for an output stage of an AM RF amplifier. More particularly, the invention relates to a power amplifier including multiple stages for selectively coupling power from a DC power supply to a load, wherein responses from the multiple stages are summed together and the number of stages that couple power to the load is determined by the amplitude of an analog signal source.

BACKGROUND ART

Power amplifiers of the pulse width modulated type are frequently used to provide modulating inputs to an output electrode of an output stage of a high power AM, RF transmitter. Some of the prior art technologies for supplying a modulating input to an output stage of a high power AM RF amplifier are Class B push-pull amplifiers and Class D pulse width modulation amplifiers. Exemplary of prior art patents disclosing such modulation sources are Hulsey et al., U.S. Pat. Nos. 4,747,161 and 4,776,036, Weaver, 4,896,372, as well as Cummings 4,140,980, Swanson 3,506,920 and Swanson 3,588,744. In these prior art devices, the modulating waveform controls the voltage supplied to the anode, i.e., plate, or output electrode, of a power transmitting tube. Basically, the plate DC power supply voltage of the output tube is varied in response to an analog modulation source.

Typically, the pulse width modulated, Class D amplifiers produce varying output signals by changing the on and off times, i.e., duty cycle and frequency, of a switch connected between a DC power supply and the plate of the output stage. In some instances, the amplitude, as well as duration, of current and voltage fed by the switched supply to the output stage is varied. The variable duration current pulses are coupled to the anode of the output stage via a low pass filter, to substantially reconstruct the original analog input signal to the power amplifier.

To obviate the disadvantages associated with high voltage switching, e.g., 30,000 volts, some power amplifiers use multiple pulse width modulation stages controlled by phase displaced pulses having the same duty cycle; see, e.g., U.S. Pat. Nos. Swanson 4,468,626, Swanson 4,164,714 and Kyrian et al 4,369,409. In these modulators, referred to in the art as polyphase pulse width modulators, the stages are switched at the same frequency, but with relative phase differences. The power fed through the multiple stages is summed.

A disadvantage of the polyphase pulse width modulation arrangement is that usually all of the stages are being switched simultaneously. This results in all of the stages being susceptible to narrow pulse distortion, as described in Hulsey, U.S. Pat. No. 4,776,036. Hence, a problem with the polyphase pulse width modulation source is that the modulating output voltage is in certain instances not an accurate replica of the analog signal supplied to the device. This results in distortion of the modulating waveform, with resulting distortion in the transmitted signal of the AM RF transmitter.

It is, accordingly, an object of the present invention to provide a new and improved power amplifier responsive to an analog signal source, wherein the amplifier derives a relatively faithful replica of the source.

It is an additional object of the present invention to provide a new and improved method of operating a power amplifier responsive to an analog signal source to cause the amplifier to derive a relatively faithful replica of the source.

Another object of the invention is to provide a new and improved high power AM RF transmitter that derives a relatively distortion free output signal.

A further object of the invention is to provide a new and improved very low distortion high power amplifier using multiple stages that are switched between a fully conducting, saturated state and a nonsourced state such that only one of the multiple stages is switching at a time to achieve high efficiency and low switching losses.

DISCLOSURE OF THE INVENTION

In accordance with one aspect of the invention, a power amplifier, particularly adapted to modulate the power supply voltage of an output stage of an AM RF transmitter, includes plural switching stages each powered by a DC source. Each of the stages is switched from a non-sourced, i.e., cut-off, state to a sourced, i.e., saturated, state in response to the amplitude of an analog modulating source exceeding a threshold amplitude for the stage, wherein each of the stages has a different threshold. Each of the stages has a pair of output terminals which are coupled and decoupled from the DC source for the particular stage while that stage is respectively in the saturated and non-sourced states so that a response derived between the output terminals of each stage is either at only a substantially zero amplitude or a predetermined amplitude. The thresholds and analog source are arranged so that the responses derived between the output terminals of the stages change between the zero and predetermined amplitudes as the amplitude of the source changes relative to the thresholds of the different stages. The output terminals of the different stages are connected together so that the responses of the different stages are summed together. A wave with a constantly changing amplitude and a constant maximum amplitude having a small value relative to the maximum value of the analog source effectively changes the threshold of each stage.

To achieve maximum linearity and minimize distortion, the waveform having a constantly changing amplitude changes linearly as a function of time. Such a waveform is achieved with a sawtooth or triangular waveform. Minimum distortion is achieved if a triangular wave having a variable frequency as a function of the amplitude and frequency of the analog source is provided. By varying the threshold, particularly in a linear manner, there is a significant reduction in distortion compared to prior art devices, such as disclosed in the aforementioned patents concerned with polyphase pulse width modulation.

While distortion is relatively low in the power amplifier disclosed in FIG. 3 of Swanson, U.S. Pat. No. 4,403,197, the relatively low distortion is achieved with a complex arrangement having a significant number of components. Responses from multiple stages, having the same output voltage and different thresholds, are added together. The stages are selectively activated to a conducting state as a function of input voltage level. As the amplitude of the input voltage increases and decreases, the number of stages activated to the conducting state increases and decreases accordingly.

In the '197 patent low distortion is achieved by comparing the voltage sum derived from the plural series connected stages with the voltage to be amplified. The resulting error signal, derived from a difference amplifier, is supplied to multiple additional stages, each driven by a DC source having a different binary weighted voltage level. The output voltages of these additional stages are selectively connected in series with the output voltages developed by the stages having equal voltages applied to them. Switches of the additional stages are closed as a function of the binary value of the aforementioned error signal. Hence, the complexity and number of components of this prior art arrangement are considerably greater than those of the present invention wherein the threshold of each stage is effectively changed in response to the constantly varying wave.

In Woodard, U.S. Pat. No. 4,724,420, DC output voltages from multiple DC sources are combined in response to the amplitude of an analog input signal. Some of the DC output voltages have the same value, while others have differing values that are weighted in accordance with a binary code. Associated with each of the DC sources is a switch. The output voltages of the multiple sources are summed together to derive an output signal that is approximately a replica of the analog input signal. The voltages having the different binary weighted values are responsive to several least significant bits derived from an analog to digital converter responsive to the analog input signal. The switches responsive to the DC sources having equal values are controlled in response to the most significant order bits of the converter so that as the amplitude of the analog signal increases above a level associated with the lowest order of the most significant bits the DC voltages of the constant amplitude sources are connected in series with each other. While this system has relatively low distortion, it requires a large number of components and is complex, requiring an analog to digital converter, as well as a binary to discrete decimal step converter and DC power supplies having differing voltages.

With the present invention, it has been found that under most circumstances distortion is minimized by arranging the maximum amplitude of the wave having a constantly changing amplitude to equal the amplitude between adjacent thresholds of the different stages. The adjacent thresholds are spaced in amplitude by approximately the same amount. This causes one of the output stages to be operating in a pulse width modulating mode while all other output stages are either fully conducting or non-sourced. As the amplitude of the input signal varies relative to the thresholds, other output stages operate in the pulse width modulating mode and the remaining output stages either conduct fully or are non-sourced.

It is possible, however, for the maximum amplitude of the constantly changing wave to have other values, as long as they are in excess of the amplitude between adjacent thresholds and the maximum amplitude is relatively small compared to the maximum amplitude of the analog signal. Thus, for example, if the maximum amplitude of the wave having a constantly changing amplitude is twice the amplitude between adjacent equal thresholds, a pair of stages are simultaneously in the pulse width modulation mode. While there may be a slight increase in distortion in this mode, such operation has the advantage of preventing errors that can occur as a result of slight threshold differences of the various stages.

Another aspect of the invention is directed to a power amplifier having multiple output stages activated only to non-sourced and conducting stages, wherein responses from the multiple stages are summed together to derive a wave that is a step wise replica of an analog input having a variable amplitude $N+k$. The number of the stages that are in the conducting state is proportional to $N$. At least one of the stages is pulse width modulated. The pulse width modulation duty cycle is proportional to $k$ so that the average value of the summed responses over one cycle of the pulse width modulation is proportional to $N+k$.

In accordance with another aspect of the invention, a power amplifier includes plural switching stages each powered by a DC source. Each of the stages is switched from a non-sourced state to a saturated state in response to the amplitude of an analog input source exceeding a threshold amplitude for the stage, wherein each of the stages has a different threshold. Each of the stages has a pair of output terminals which are coupled and decoupled from the DC source for the particular stage while that stage is respectively in the saturated and non-sourced states so that a response derived between the output terminals of each stage is either at only a substantially zero amplitude or a predetermined amplitude. The thresholds and analog source are arranged so that the responses derived between the output terminals of the stages change between the zero and predetermined amplitudes as the amplitude of the source changes relative to the thresholds of the different stages. The output terminals of the different stages are connected together so that the responses of the different stages are summed together. From time to time the effective thresholds of the stages are changed so that at different times different ones of the stages are in the non-sourced and conducting states for the same amplitude of the modulating source, while providing the same summed response for the same amplitude of the analog source.

By changing the threshold of different stages so that at different times different ones of the stages are in the non-sourced and conducting states for the same amplitude of the analog source, dissipation losses in the several stages are equalized to a large extent. Thereby, the tendency for certain stages to overheat and become susceptible to failure is substantially obviated. In other words, the load is shared amongst the different stages to maximize amplifier life.

It is, accordingly, another object of the present invention to provide a new and improved high power amplifier including plural switched stages having summed responses, wherein the power dissipation of the several stages is approximately equalized to increase the life of each stage and the amplifier as a whole.

In accordance with a further feature of the invention, the DC power source for each stage includes an isolated AC-DC converter. The converter for each stage includes a multi-phase transformer secondary winding, such that the secondary windings associated with several of the stages are coupled to a single multi-phase primary winding. The primary and secondary windings are coupled to each other so that the current and voltage in each stage produce a power factor close to unity while each stage is in a conducting state.

In accordance with a further aspect of the present invention, an AC transmitter responsive to a modulating source and a carrier source includes an output stage having a control electrode responsive to the carrier source and an output electrode coupled to a power amplifier responsive to the modulating source of the aforementioned type. The output electrode is coupled to an antenna. The summed responses are applied to a power supply terminal for the output electrode. Such a transmitter derives an AM RF high power signal having relatively low distortion. In addition, such a transmitter has relatively long life because the loads of the multiple stages are approximately equalized as a result of the different stages being activated to a conducting state at different times for the same modulating source amplitude.

It is, accordingly, a further object of the invention to provide a new and improved power amplifier and method of operating same whereby dissipation is substantially equalized among several output stages.

The above and still further objects, features and advantages of the present invention will become apparent upon consideration of the following detailed description of plural specific embodiments thereof, especially when taken in conjunction with the accompanying drawings.

DESCRIPTION OF THE PREFERRED EMBODIMENTS

Figure 1:
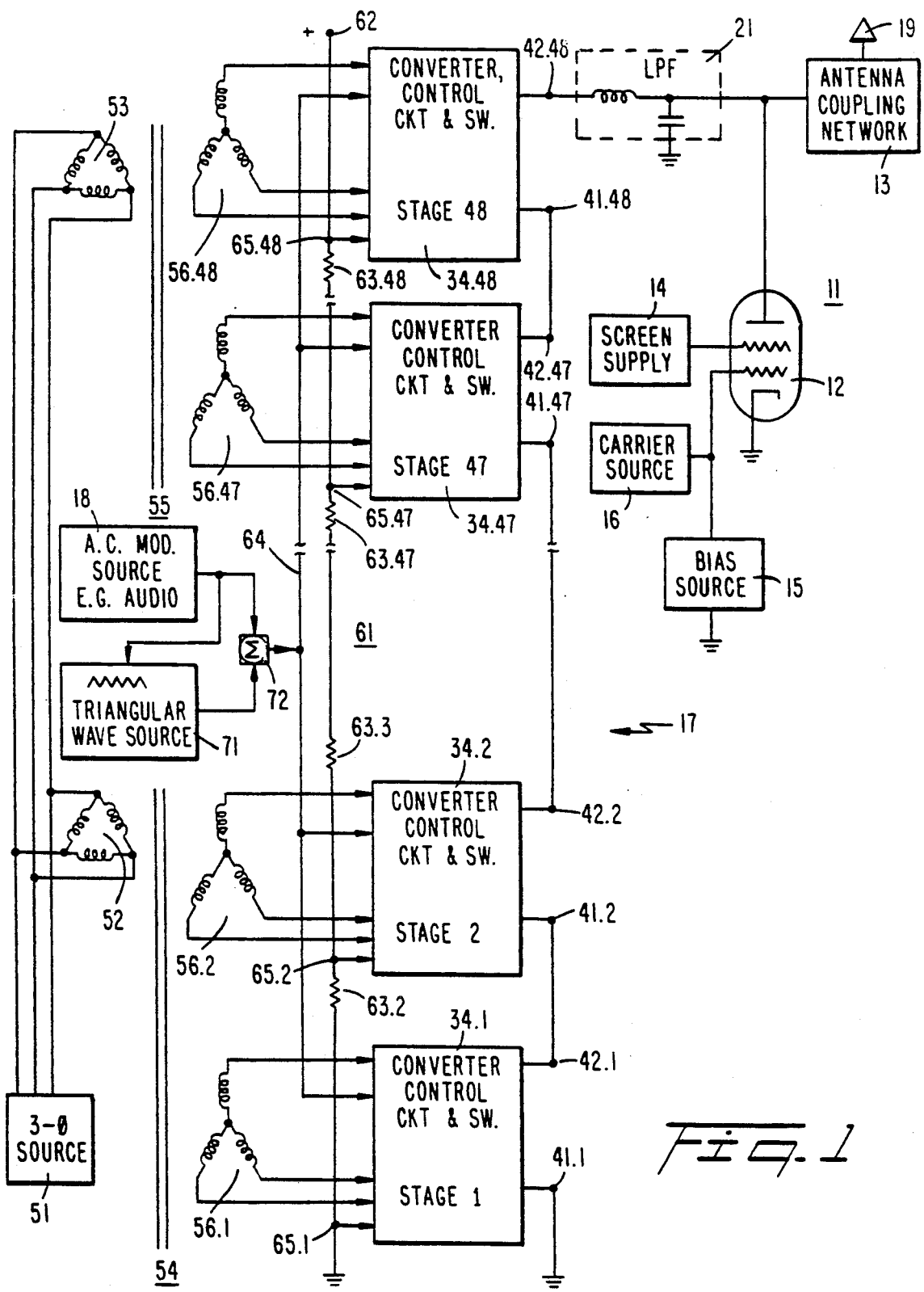
FIG. 1 is a block and circuit diagram of a transmitter including a power amplifier in accordance with one embodiment of the invention.

Reference is now made to FIG. 1 of the drawing, a block and circuit diagram of a transmitter including an embodiment of the present invention. The transmitter includes high power output stage 11 including tetrode tube 12, antenna coupling network 13, screen supply 14, DC bias source 15 and r.f. carrier source 16. Bias source 15 and carrier source 16 are selected so that tetrode 12 is activated to be driven in any of Class B, C, or G. A modulation voltage is applied as the power supply voltage for the anode, i.e., plate, of tetrode 12 by a modulation source including modulator 17. In actuality, modulator 17 is a high power amplifier responsive to AC analog modulation source 18, typically an audio, voice source that varies between a zero voltage level and a predetermined maximum level. Tetrode 12 responds to the outputs of sources 15 and 16, the voltage of supply 14 and the variable amplitude DC voltage applied to plate 11 thereof to derive an amplitude modulated wave having a center frequency equal to that of carrier source 16. The wave derived by tetrode 12 is applied to antenna 19 by way of antenna coupling network 13.

Power amplifier 17 derives a variable amplitude, variable frequency wave that is approximately a replica of the wave derived by source 18. The wave derived by amplifier 17, however, has step variations at discrete voltage levels. Typically, the step variations are approximately 600 volts. In one embodiment, 48 different steps subsist between the minimum and maximum voltages derived by amplifier 17 so the maximum voltage is approximately 28,800 volts, at a power level of about 500 kilowatts. The output of amplifier 17 is smoothed or averaged by low pass filter 21 as it is applied to the plate of tetrode 12 so that the tetrode plate voltage is a close replica of the wave of source 18.

In one embodiment, power amplifier 17 includes 48 different stages 34.1, 34.2, 34.3...34.46, 34.47 and 34.48; for convenience only the first two and last two stages, i.e., stages 34.1, 34.2, 34.47 and 34.48, are illustrated. Like components of the different identical stages bear the same reference numerals to the left of a decimal point, while components of the same stage have the same reference numeral, equal to the stage number, to the right of the decimal point. In the following description, stage 34.1 is discussed in detail. Since all of stages 34 are the same, the discussion of stage 34.1 is generally sufficient for all of the stages. The number of stages can be greater or smaller than 48, but in any event at least several stages are provided.

Responses from all of stages 34 are summed together by adding output voltages of the different stages together. The output voltages are added together by stacking the voltages at the output terminals of the different stages together.

Each of stages 34 is selectively in a fully sourced, i.e., saturated, state or a non-sourced, i.e., zero output voltage, state. Each of stages 34 is powered by a DC source having the same voltage. While each stage is in a fully conducting (saturated) state, the DC voltage applied to the particular stage is applied to output terminals 41 and 42 of the stage. While a particular stage 34 is non-sourced, the output voltage and output impedance of the stage drop virtually to zero.

Output terminals 41 and 42 are connected in series between ground and the input of low pass filter 21. Hence, terminal 41.1 is grounded, terminals 42.1 and 41.2 are connected together as are terminals 42.47 and 41.48, while terminal 42.48 is connected to filter 21. The sum of the voltages at output terminals 41 and 42, as derived at terminal 42.48, is thus supplied as a variable amplitude DC voltage to low pass filter 21.

DC power for each of stages 34 is derived from three-phase AC power source 51. Source 51 drives delta connected primary windings 52 and 53 of transformers 54 and 55 in parallel. Winding 52 drives isolated wye connected three-phase secondary windings 56.1-56.24 while transformer 53 drives similarly connected secondary windings 56.25-56.48. Primary windings 52 and 53 include taps (not shown), adjusted so that the AC current flowing into each of stages 34 is approximately in phase with the voltage developed across the AC input terminals of the particular stage; in other words, the power factor of the power supplied to each of stages 34 is close to unity while the particular stage is conducting, to maximize efficiency. To these ends the taps of windings 52 and 53 are adjusted so that there is approximately a 30° phase shift in the current applied to the primary windings relative to the current derived from secondary windings 56.1-56.48. Two different primary windings 52 and 53 are provided because of problems associated with closely coupling more than approximately 24 three-phase secondaries to a single three-phase primary. Each of stages 34 includes a full wave three-phase rectifier for converting the three-phase input of the particular stage into a DC voltage having relatively low ripple and constant amplitude.

Each of stages 34 is driven in parallel by the output of AC analog modulation source 18. Each of stages 34 has a different threshold for the output voltage level of source 18. The different thresholds are established by connecting resistive voltage divider 61 between a positive DC voltage at terminal 62 and ground. Voltage divider 61 includes a different tap 65 for each of stages 34. Equal valued resistors 63 are connected between adjacent taps so the voltage difference between adjacent taps is the same. In one embodiment, the voltage of source 62 is 4.8 volts so the voltages at taps 65.1, 65.2 . . . 65.47 and 65.48 are respectively 0, 0.1 . . . 4.7 and 4.8 volts.

The threshold values applied by taps 65 of voltage divider 61 to stages 34 are compared with an analog voltage on lead 64. In response to the threshold of a particular stage 34 being less than the voltage applied to that stage by the voltage on lead 64 the particular stage is activated into a fully conducting, saturated state. In response to the threshold applied by voltage divider 61 to a particular stage being greater than the voltage applied to the stage via lead 64, the particular stage is in a non-sourced state.

Stage 34.1 is connected to a grounded tap of voltage divider 61 so that stage 34.1 is conducting whenever the voltage on lead 64 exceeds a zero amplitude, which is the vast majority of the time. The voltage at terminal 62, applied to stage 34.48, equals the maximum voltage of source 18. Stage 34.48 is activated into a fully conducting, saturated state for only a small percentage of the operating time of the amplifier. In the discussed embodiment, stage 34.1 is conducting at all times except a portion of the time while the voltage of source 18 is less than 0.05 volts; stage 34.48 is fully conducting only a portion of the time the voltage of source 18 exceeds 4.75 volts. When the voltage of source 18 equals 0.0 or 4.8 volts, each of stages 34.1 and 34.48 has a 50% duty cycle, respectively. As the voltage of source 18 varies between slightly more than 0.05 volts to slightly less than 4.75 volts intermediate ones of stages 34, i.e., stages 34.2-34.47, are in fully conducting and nonsourced states for variable times that primarily are a function of the amplitude of source 18. As the amplitude of source 18 increases and decreases the number of fully conducting stages increases and decreases accordingly, so the number of fully conducting stages is basically a linear function of the amplitude of source 18.

Each of stages 34 is activated between a fully conducting, and non-sourced state as a function of the amplitude of audio source 18, the threshold voltage applied to the particular stage by voltage divider 61 and a factor that effectively varies the threshold of all of the stages simultaneously multiple times during each cycle of source 18. The variation in effective threshold level of each stage 34 is by an amount at least equal to the threshold between adjacent stages.

In one configuration of the device which has actually been constructed, the threshold variation was equal to the difference between adjacent thresholds. It was found that such variations materially reduced the distortion of the modulating voltage applied by low pass filter 21 to the plate of tetrode 12 relative to the situation that would have occurred without a variable threshold. It is also feasible for the threshold variation to be equal to the threshold of more than one stage, as long as the threshold variation is only a small percentage of the maximum voltage of source 18. If the threshold variation is twice the threshold between an adjacent pair of stages 34, the outputs of the two stages are averaged and eliminate control problems for the voltages at taps 65.

The variable threshold for stages 34 is attained by linearly combining the output of triangular wave source 71 with the output of source 18 in summing network 72. Triangular wave source 71 has a minimum frequency that is at least twice and preferably several times the highest frequency of source 18. The maximum voltage amplitude of the output of triangle wave source 71 is constant at a relatively small percentage of the maximum amplitude derived by source 18. Since source 71 effectively varies the threshold of each of stages 34, the maximum voltage amplitude of the wave derived by source 71 is at least equal to the difference between the threshold of adjacent pairs of stages 34.

Source 71 is preferably a triangular or linear sawtooth wave, to provide maximum linearity and minimize distortion in the signal coupled by low pass filter 21 to the plate of tetrode 12. Linearity is achieved because the conducting time of each output stage 34 that is switched is directly proportional to the instantaneous amplitude of the voltage of source 18; hence the switched stage 34 is pulse width modulated. While source 71 preferably has a linear variation other waveforms could be used for this source. For example, source 71 could, in certain situations, be a sine wave.

Enhanced linearity is achieved by varying the frequency of source 71 as a function of the amplitude and frequency of the output of source 18. As the frequency and amplitude of source 18 increase, the frequency of source 71 increases accordingly. To this end, the output of source 18 is coupled to an input of source 71. It is to be understood, however, that source 71 can also be a constant frequency source that is unresponsive to the output of source 18.

In a preferred embodiment, source 71 is constructed in a manner illustrated in FIG. 6 of previously mentioned U.S. Pat. No. 4,896,372. In such an instance, the variable frequency, constant amplitude triangular wave derived from source 71 has a frequency that increases and decreases as an RMS-like function of the amplitude of source 18. In addition, the frequency of the triangular wave output of source 71 increases and decreases as the frequency of source 18 increases and decreases. To this end, triangular wave source 71 is constructed identically to the triangular wave source and the components connected to the input thereof as disclosed in FIG. 6 of the aforementioned 4,896,372 patent.

The operation of power amplifier 17 is better understood by considering an example wherein the voltage at terminal 62 is 4.8 volts, the voltage across each of resistors 63 is 100 millivolts and the voltage of source 71 varies between −0.05 and +0.05 volts. In this example (1) the voltage of source 18 varies between zero and 4.8 volts, (2) the voltage at the output terminals of each of stages 34 varies between 600 and zero volts when the stage is respectively switched to the saturated and non-sourced states, and (3) the voltages of sources 18 and 71 are both initially zero volts. Under these initial conditions, all of stages 34 are in a non-sourced condition. At terminal 42.48 a zero voltage is derived causing a low level signal to be applied by low pass filter 21 to the plate of tetrode 12.

Next assume that time has progressed so the amplitude of source 18 is still at a zero level, but that the amplitude of source 71 has increased to 25 millivolts. Under these conditions, the zero threshold level of 34.1 is exceeded, causing that stage to be activated into a saturated state, while each of stages 34.2-34.48 remains non-sourced. A 600 volt DC level is thereby derived at terminal 42.48 to increase the output voltage of filter 21.

Next assume that time has progressed so that the output voltage of source 71 is plus 50 millivolts, and the voltage of source 18 has increased to plus 75 millivolts so that the signal on lead 64 is 125 millivolts. The 125 millivolt signal on lead 64 is compared with the zero and 100 millivolt threshold inputs to stages 34.1 and 34.2 from voltage divider 61 and the thresholds of stages 34.3-34.48, none of which is less than 200 millivolts. This causes stages 34.1 and 34.2 to be activated into a fully conducting state, while the remaining stages 34.3-34.48 are in a nonsourced state. Thereby, the voltage at terminal 42.48 increases to 1200 volts.

Next assume that the voltage of source 71 drops to minus 25 millivolts, while the voltage of source 18 increases to 85 millivolts, so that the voltage on lead 64 is plus 60 millivolts. This causes stage 34.1 to remain in the fully conducting state, but causes stages 34.2-34.48 to be in the non-sourced state. Stage 34.2 reverted to a non-sourced state when the voltage on lead 64 dropped below 100 millivolts.

The duration of the time while stage 34.2 is in a conducting state is primarily linearly related to the instantaneous amplitude of source 18, and is secondarily related to the RMS amplitude and frequency of source 18, for the reasons described supra in conjunction with the control of source 71. The output voltage of stage 34.2 varies between zero and 600 volts in response to variations of source 18 while the voltage of source 18 varies between 50 and 150 millivolts. The duration of the 600 volt levels derived by stage 34.2 is linearly related to the amplitude of source 18, as long as the amplitude of the source is between the 50 and 150 millivolt levels.

Thus, stage 34.2 derives a pulse width modulated voltage that varies between zero and 600 volts. The average value of the pulses is proportional to variations of source 18 between the 50 and 150 millivolt levels. This pulse width modulated wave is superimposed on the 600 volt output of stage 34.1 so that the output of averaging filter 21 is a high voltage replica of the variations of source 18.

As the amplitude of source 18 increases and decreases, there are progressive increases and decreases in the number of stages 34 activated into a fully conducting state. For example, in response to summing circuit 72 deriving an instantaneous output level of 2.375 volts, half of the stages of amplifier 17 (viz: stages 34.1-35.24) are in a conducting state, while the remaining stages (viz: stages 34.25-34.48) are in a non-sourced state.

From the foregoing, the voltage at terminal 42.48 is a high voltage stair step waveform having 48 possible steps. While the voltage is at any one of the steps, variable width pulses having an amplitude of one step are derived. The widths of the pulses are linearly related to the instantaneous amplitude of source 18 in the threshold region for a particular one of stages 34. Because of the effective threshold variation provided by triangular wave source 71 for each of stages 34, the average value of the stair step wave at terminal 42.48 accurately tracks amplitude variations of source 18. Low pass, averaging filter 21 thereby derives an accurate high voltage replica of the waveform of source 18, without the switching losses associated with switching a high voltage source.

Figure 2:
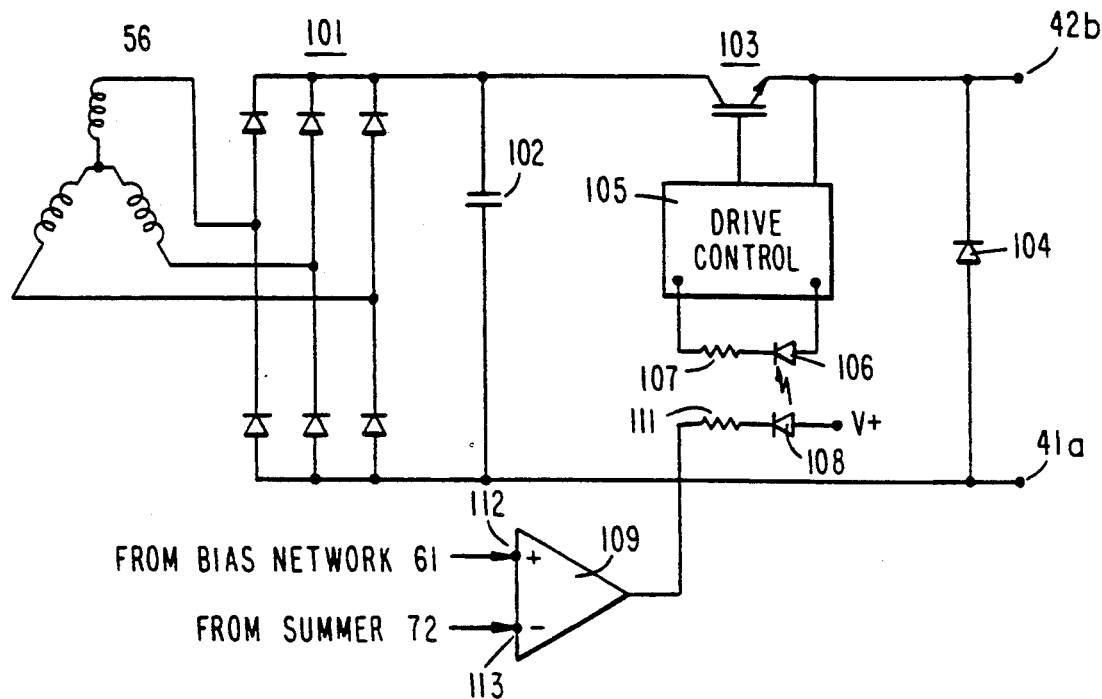
FIG. 2 is a circuit diagram of one stage of the amplifier illustrated in FIG. 1.

A circuit diagram for a preferred embodiment of each of stages 34 is illustrated in FIG. 2. Each of stages 34 is provided with DC power by converting the three-phase AC voltage at secondary winding 56 of transformer 54 or 55 into a DC voltage; to this end the voltage of secondary winding 56 is supplied to threephase rectifier 101. Rectifier 101 drives shunt capacitor 102 across which is developed a 600 volt DC power supply voltage. The voltage across capacitor 102 is selectively switched to output terminals 41 and 42 through the emitter collector path of isolated gate bipolar transistor 103 although other similar devices can be used. Transistor 103 has bipolar emittercollector characteristics and high impedance gate, i.e., control electrode, characteristics similar to those of a metal oxide semiconductor field effect transistor. Transistor 103 includes collector and emitter electrodes respectively connected to one electrode of capacitor 102 and the cathode of diode 104. The anode of diode 104 is connected to the remaining electrode of capacitor 102. Diode 104 is connected across output terminals 41 and 42.

Bias control between the gate and emitter of transistor 103 is provided by circuit 105. Circuit 105 switches the emitter collector path of transistor 103 between a saturated and non-conducting state. In the saturated state, the DC voltage across capacitor 102 is coupled to terminals 41 and 42, while causing diode 104 to be back biased. When transistor 103 is not conducting, the voltage between terminals 41 and 42 drops quickly to zero by virtue of the relatively low impedance path provided through the anode and cathode of diode 104. Thereby, the impedance between terminals 41 and 42 is maintained at a first predetermined constant value while transistor 103 is in a conducting state, and is maintained at a second, much lower predetermined value while the transistor is not conducting.

Circuit 105 is controlled by an opto-electronic link including photodiode 106, connected to input terminals of circuit 105 via current limiting resistor 107. Diode 106 is optically coupled (e.g. by a fiber optic link) to light emitting diode 108, connected via resistor 111 to be responsive to the output of comparator 109.

Comparator 109 includes positive and negative input terminals 112 and 113, respectively responsive to the voltage at tap 65 of bias network 61 for the particular stage 34 and the voltage from summing network 72. In response to the signal at terminal 112 exceeding the voltage at terminal 113, comparator 109 derives a binary one output level. Comparator 109 derives a binary zero output level in response to the voltage at terminal 112, from bias network 61, being less than the voltage at terminal 113, from summing network 72.

In response to comparator 109 deriving a binary zero level, diode 108 is activated to illuminate photodiode 106. In contrast, diode 108 derives no optical signal in response to a binary one output of amplifier 109. In response to diode 106 being illuminated, circuit 105 is activated to cause transistor 103 to be in the saturated state. When no optical energy is incident on diode 106, transistor 103 does not conduct. The voltages from summing network 72 and bias network 61 are linearly combined to control the conducting state of the switch of stage 32 comprising transistor 103.

In accordance with a further aspect of the invention (illustrated in FIGS. 3 and 4) a given analog input voltage causes different stages 34 to be activated to derive the same output voltage sum as is provided in the embodiment of FIGS. 1 and 2 for the given voltage. Selection of which of stages 34 are conducting is a function of prior variations of AC modulation source 18, as well as the instantaneous value thereof. Insofar as the variations of modulation source 18 are random, the selection of which stages 34 is conducting is random. By randomizing which of stages 34 are conducting, certain stages are not almost always dissipating power, while other stages are virtually never dissipating power. Thereby power is distributed approximately equally amongst the various stages 34 to substantially equalize dissipation in the stages and prevent overheating of a particular stage. This is in contrast to FIG. 1, wherein the lowest numbered stages (e.g. stages 34.1, 34.2 etc.) are almost always conducting and the highest numbered stages (e.g. stages 34.48, 34.47 etc.) are virtually never conducting.

To these ends, the voltages of sources 18 and 71 are linearly combined in summing network 72 and compared in comparators 109.1–109.48 with the voltages at taps 65 on voltage divider 61. Comparators 109.1–109.48 derive binary levels in the same manner that binary levels are derived by the corresponding comparators 109 in stages 34.1–34.48 of FIG. 1.

To control which of output stages 34.1–34.48 are in the conducting and non-sourced states as a function of the present and prior values of modulation source 18, a comparison is made of the number of comparators 109.1–109.48 in the binary one state with the number of output stages 34 in the conducting state. The arrangement is such that if, for example, the amplitude of source 18 remains constant, the number of output stages 34 in an activated state remains constant; however, which ones of output stages 34 are activated constantly changes, despite the fact that the amplitude of source 18 does not change. For example, if the voltage of source 18 is 2.4 volts, 24 of the 48 stages 34.1–34.48 are conducting. During one instant, while the voltage of source 18 is 2.4 volts, stages 34.7–34.30 may be conducting; during a subsequent instant stages 34.8–34.31 will be conducting. During both instants, the sum of the voltages derived by stages 34 is 24×600=14,400 volts.

To these ends, an indication of the number of comparators 109.1–109.48 deriving binary one levels is derived by supplying the binary one output levels of these comparators to analog adding network 121. The output voltage of analog adding network 121 is a DC voltage having, at any one time, one of 48 possible values. Each of the possible output values of analog adder 121 represents the number of comparators 109.1–109.48 which is deriving a binary one level.

The outputs of comparators 109.1–109.48 are sampled many times during each cycle of triangle wave source 71 by respectively supplying the outputs of comparators 109.1–109.48 to sample and hold, i.e., latch, networks 122.1–122.48, also responsive to clock source 123, having a frequency of several megaHertz. The latched outputs of latches 122.1–122.48 are applied to analog summing circuit 121. As variations in modulation source 18 and wave source 71 occur, the output level of circuit 121 changes accordingly.

The output signal of adder 121 is compared with a signal indicative of the number of stages 34 in a fully conducting state, as derived from analog adder 125. Adder 125 is responsive to latch networks 133.1–133.48 respectively responsive to 48 different binary states of ring modulator 127 and clock 123. Analog adder 125 derives an output having one of 48 different levels, each representing the conducting and non-conducting states of stages 34.1–34.48. The output signals of adders 121 and 125 are supplied to analog comparator 126 which selectively derives one of two positive going, i.e., binary zero to one, transitions as a function of the output signals of adders 121 and 125.

Comparator 126 includes difference amplifier 140 as well as comparators 141 and 142; amplifier 140 has plus and minus inputs respectively responsive to the voltages derived by adders 121 and 125. The output of amplifier 140 is applied in parallel to negative and positive inputs of 141 and 142, having positive and negative inputs respectively responsive to negative and positive DC reference voltages, −Vref and +Vref, where Vref is typically 50 millivolts. In response to the voltage from amplifier 140 applied to the negative input of comparator 141 having a larger negative voltage than −Vref, comparator 141 derives a binary one level; in response to the voltage at the positive input of amplifier 142 exceeding +Vref, comparator 142 derives a binary one output. If the output of difference amplifier 140 is between a dead band from −Vref to +Vref, the outputs of comparators 141 or 142 are at the binary zero level and no changes occur in ring modulator 127.

The transitions at the outputs of comparator 126 control which of output stages 34.1–34.48 are in conducting and non-sourced states. To this end, the outputs of comparator 126 are supplied to two separate input terminals of ring modulator 127, also responsive to clock source 123. Ring modulator 127 includes 48 output leads, one for each of output stages 34.1–34.48. The number of output stages 34 in a conducting state is generally equal to the number of comparators 109.1–109.48 deriving binary one levels. However, there is no other correlation between which of stages 34 are conducting and which of comparators 109.1–109.48 are deriving binary one levels.

Ring modulator 127 includes two sets of output leads 128.1–128.48 and 129.1–129.48, respectively driven in parallel by binary signals representing which of stages 34.1–34.48 are fully conducting and nonsourced. The signals on output leads 128.1–128.48 are supplied as control inputs to stages 34.1–34.48. These controls include fiber optic links, as described supra with regard to FIGS. 1 and 2. The signals on output leads 129.1–129.48 are supplied as inputs to latches 133.1–133.48, thence to analog adder 125.

Figure 4:
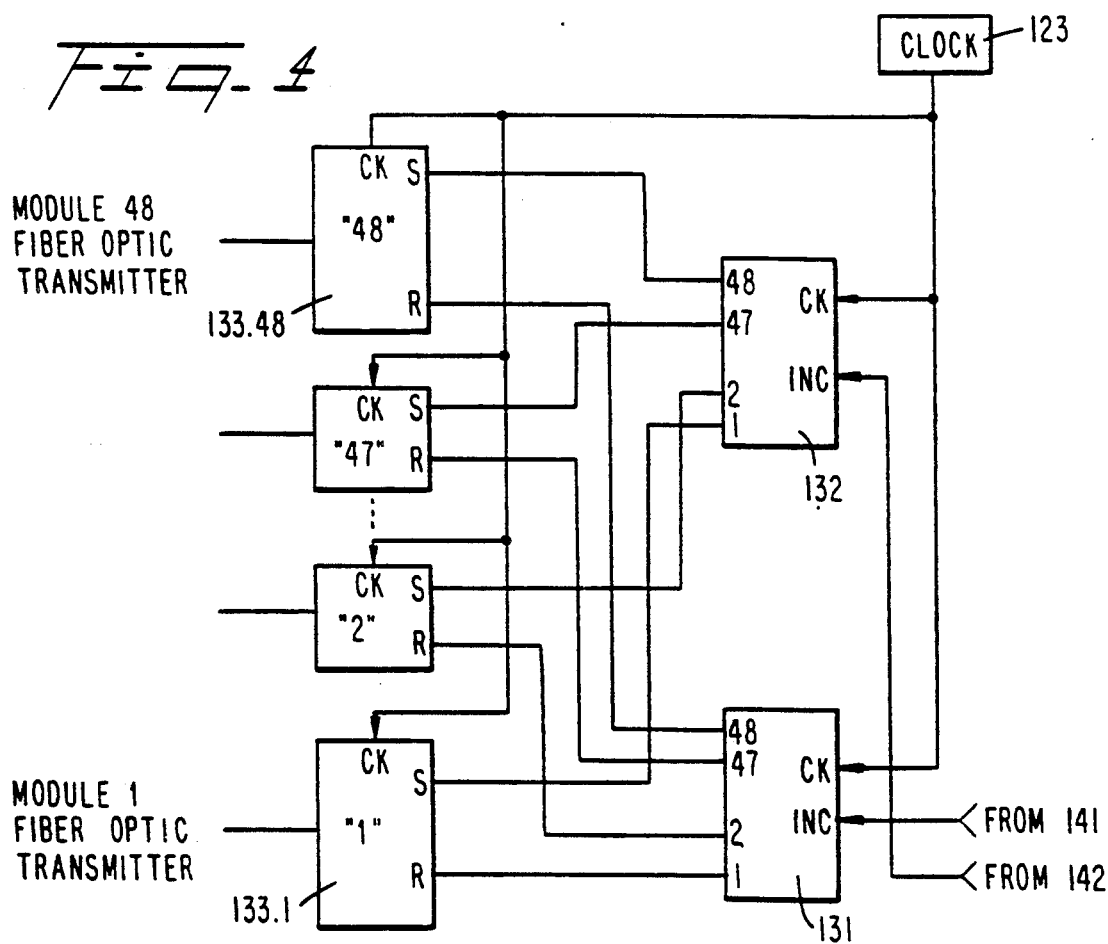
FIG. 4 is a block diagram of a ring modulator included in the amplifier of FIG. 3.

Details of a preferred embodiment of ring modulator 127 are illustrated in FIG. 4 as including two 48 stage recirculating shift registers 131 and 132 and 48 output latches 133.1–133.48, each configured as a J-K flip-flop. Each of shift registers 131 and 132 includes an increment (INC) input terminal responsive to a separate output of comparator network 126 and a clock input terminal responsive to clock source 123. Shift registers 131 and 132 are driven only in a forward direction, so that in response to transitions supplied to the increment inputs thereof, the shift register stage in a binary one state is advanced by a count of one. Only one stage of shift registers 131 and 132 is in a binary one state at a particular time. When a binary one state is in the final stage, i.e., stage 48, of each of shift registers 131 and 132 the binary one state of the shift register advances to stage one in response to the next occurrence of a positive going transition at the increment input terminal of the shift register. The state of shift registers 131 and 132 is advanced during the positive going transition of clock 123 immediately following a positive going transition at the increment input of the shift register.

Shift register 131 is incremented in response to binary zero to one transitions in the output of comparator 141, while shift register 132 is incremented in response to binary zero to one transitions in the output of comparator 142. To this end, the outputs of comparators 142 and 141 are respectively connected to the increment inputs of shift registers 132 and 131.

Each of latches 133.1–133.48, one of which is provided for each of stages 34.1–34.48, includes a set (S) and a reset (R) input, as well as a clock input. The clock inputs of latches 133.1–133.48 are driven in parallel by the output of clock source 123. The set inputs of latches 133.1–133.48 are respectively connected to output leads of each of stages 1–48 of shift register 132. The reset inputs of latches 133.1–133.48 are respectively connected to output leads of each of stages 1–48 of shift register 131. The output terminals of latches 131.1–133.48 supply binary one levels to output leads 127.1–127.48 when the latches are set, i.e., in a binary one state.

Each of flip-flops 133.1–133.48 is of a type such that the latches or flip-flops are in a binary zero state in response to a binary zero state being supplied to the reset inputs thereof during the previous clock pulse input thereof. Flip-flops 133.1–133.48 are in a binary one state in response to a binary one state being applied to the set inputs thereof during the previous clock pulse input thereof. If a binary one is applied to both the reset and set inputs of a particular flip-flop 133.1–133.48 during a particular clock period, the output state of the particular flip-flop toggles to the opposite binary state, i.e., changes from one to zero or zero to one. Changes in the states of flip-flops 133.1–133.48 occur only during a positive going transition of clock 123 following a binary zero to one transition at the set or reset input of the particular flip-flop.

Conventional reset circuitry, not shown, causes shift registers 131 and 132 to be activated so that stage one thereof is initially set to a binary one state, while each of latches 131–133.48 is initially in the reset condition.

In operation, the stages of shift registers 131 and 132 having binary one values therein generally indicate the limits of output stages 34 which are respectively in the reset and set stages; these stages of shift registers 131 and 132 are respectively represented by N(r) and N(s). If N(s) is greater than N(r), output stages 34.N(r+1) through 34.N(s) are conducting while output stages 34.1 through 34.N(r) and 34.N(s+1) through 34.48 are non-sourced. If N(r) is 34.N(s−1) are non-sourced while output stages 34.1 through 34.N(r−1) and 34.N(s) through 34.48 are conducting. If N(r) equals N(s), either all or none of output stages 34.1 through 34.48 are conducting.

The number of output stages which should be in a conducting state, indicated by the output of adder 121, is compared in comparator 126 with the number of output stages 34 in a conducting state, as indicated by the output of adder 125. In response to the output of adder 121 exceeding the output of adder 125 by an amount greater than the deadband between −Vref and +Vref during a cycle time of clock 123, the count in shift register 132 is incremented by a count of one during that cycle time; conversely shift register 131 is incremented by a count of one in response to the output of adder 125 exceeding that of adder 121 during a cycle time of clock 123. Because the states of shift registers 131 and 132 are only incremented in response to the transitions in the outputs of comparator 126, which in turn are responsive to variations of analog source 18 relative to the thresholds established by voltage divider 61 and triangular wave source 71, the relative values of N(s) and N(r) change in response to the amplitude of the output of adder 72, relative to the thresholds established by network 61. Thereby which of stages 34 are conducting changes on a consistent basis, to prevent constant dissipation in the lowest number stages, as is the case with the amplifier of FIG. 1. Each of stages 34 has, in effect, a different threshold that is subject to change depending on the values of N(r) and N(s).

Figure 3:
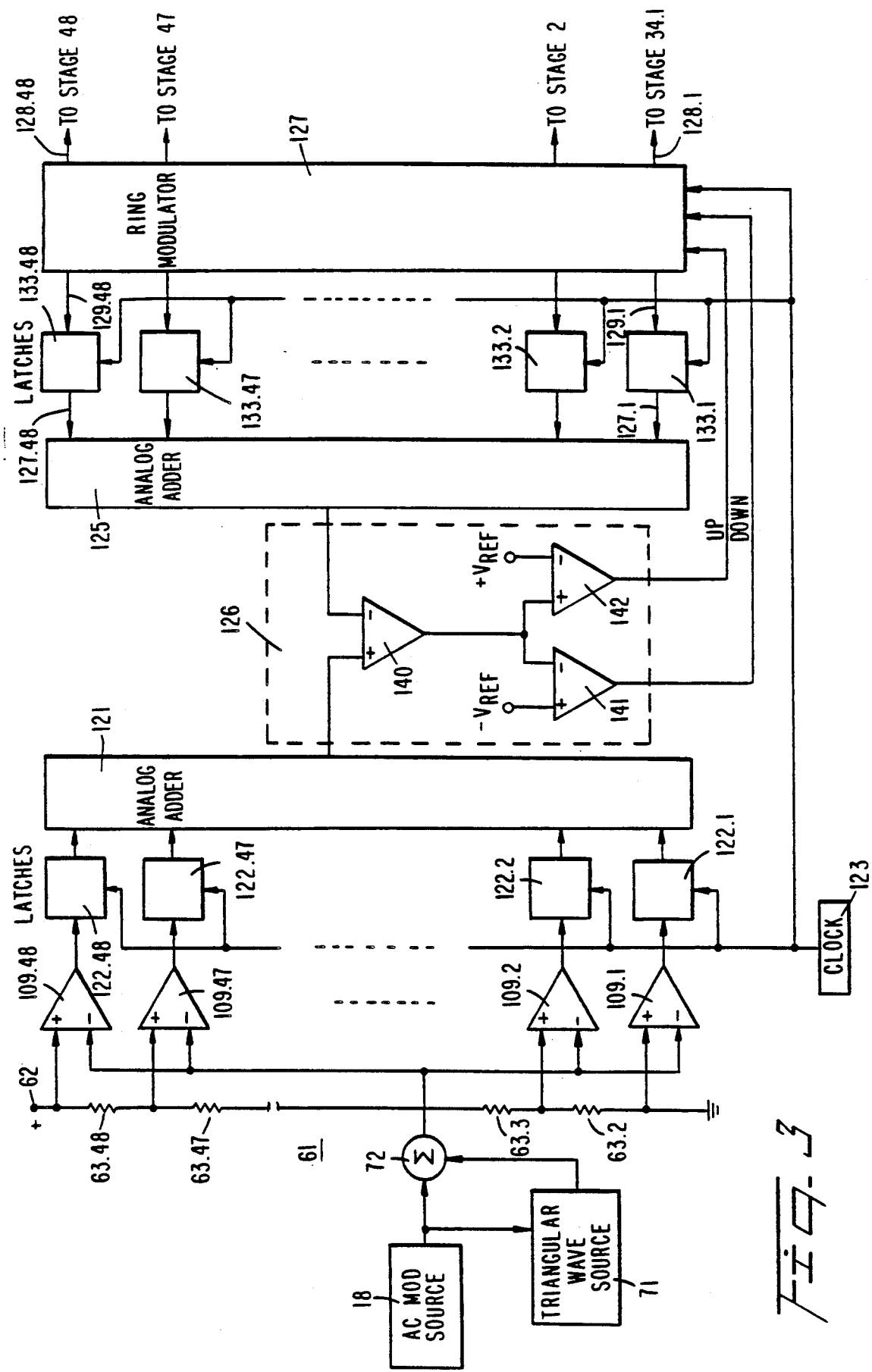
FIG. 3 is a circuit and block diagram of a modification of the amplifier wherein different stages are activated at different times in response to an AC signal having the same amplitude, to derive an output voltage having the same amplitude at the different times.

To provide a better understanding as to the manner in which the circuits of FIGS. 3 and 4 operate, consider the following example: ring modulator 127 is set to its initial condition, such that binary one levels are in stages one of shift registers 131 and 132 and each of latches 133.1–133.48 is in a reset condition so that binary zero levels are derived from all of the latches or flip-flops; the voltage of AC modulation source 18 has just been turned on and is at a level of 40 millivolts, i.e., 0.040 volts; triangle wave source 71, which varies between minus 50 millivolts and plus 50 millivolts, has a zero level; the binary zero and one output levels of comparators 109.1–109.48 and latches 122.1–122.48 are respectively zero and 100 millivolts.

Under these conditions, a binary one level is derived from comparator 109.1 and each of comparators 109.2–109.48 derives a binary zero level. This causes the output of analog adder 121, between the first and second positive going transitions from clock source 123, to be at a voltage level of 100 millivolts. The output of analog adder 125 at this time is at a zero voltage level. These levels are supplied to comparator network 126, to cause comparator 142 to have a positive going transition. The positive going transition in the output of comparator 142 is sensed by shift register 132 after the next positive going transition of clock source 123. This causes shift register 132 to change state so that stage two thereof has a binary one state loaded therein, while the remaining stages of shift register 132 are at the binary zero state. Because shift register 131 is unresponsive to the positive going transition at the output of comparator 142, stage one thereof remains at the binary one state, while stages 2–48 of shift register 131 are at the binary zero level.

In response to the transition of stage two of shift register 132 from a binary zero to a binary one state, flip-flop 133.2 changes state from a binary zero to a binary one in response to the next positive going transition of clock source 123. The remaining flipflops 133.1 and 133.3–133.48 stay in the binary zero state.

In response to flip-flop 133.2 being latched to a binary one state, output stage 34.2 is driven into a conducting state. The remaining output stages 34.1 and 34.3–34.48 stay in a non-conducting state. In response to the next positive going transition of clock source 123, a voltage level of 100 millivolts is applied by adder 125 to comparator 126. Because the two inputs to comparator network 126 are now equal, the outputs of the comparator network do not change. Hence, there are no transitions in the output of comparator network 126 and there are no changes of state in shift registers 131 and 132. The states of shift registers 131 and 132, as well as flip-flops 133.1–133.48, do not change under these circumstances and remain the same until there is another transition in the output of comparator 126.

The next transition in the output of comparator 126 is derived from comparator 141 as a result of the voltage of triangle wave source 71 dropping to a level of −40 millivolts. At this time, summing network 72 derives a negative output voltage, causing comparator 109.1 to derive a binary zero output. Comparators 109.2–109.48 continue to derive binary zero outputs. The output voltage of analog adder 121 thereby drops to a zero level in response to the next positive going transition of clock source 123, then a zero level is coupled by adder 121 to one input of comparator 126. At this time, a 100 millivolt level is still applied by adder 125 to the other input of comparator 126. In response to the zero and 100 millivolt inputs to comparator 126 from adders 121 and 125, comparator 141 derives a positive going transition.

The positive going transition at the output of comparator 141 is coupled to the increment input of shift register 131. This causes the binary one signal to be shifted from stage one of register 131 to stage two thereof. The transition in the output of amplifier 141 has no effect on the state of shift register 132. Under the stated circumstances stage two of each of shift registers 131 and 132 is loaded with a binary one, while the remaining stages of the shift registers are at a binary zero level.

The binary zero to one transition of stage two of shift register 131 is coupled to the reset input of flip-flop 133.2. The binary zero to one transition at the reset input of flip-flop 133.2 causes flip-flop 133.2 to revert to the binary zero state. Thereby, output stage 34.2 returns to the same non-sourced state as output stages 34.1 and 34.3–34.48. This causes the input to analog adder 125 to drop from 100 millivolts to zero volts.

The outputs of comparator 126 are unresponsive to the changes in the output of analog adder 125 since both input voltages to the comparator are the same. Thereby, ring modulator 127 remains in its previous state, such that shift registers 131 and 132 have binary one's loaded in stages two thereof and all of flip-flops 133.1–133.48 are reset, i.e., derive binary zero levels.

The outputs of adders 121 and 125 remain as stated until the voltage of triangular wave source 71 increases to a value of at least minus 40 millivolts. In response to the voltage of source 71 increasing to minus 40 millivolts, the output of summing network 72 increases above zero, but remains at a level less than the 100 millivolt threshold of comparator 109.2. Thereby, comparator 109.1 derives a binary one level, to the exclusion of each of comparators 109.2–109.48. This causes a +100 millivolt signal to be derived by amplifier 140 of comparator 126. There is a corresponding positive going transition in the output of comparator 142. The positive going transition in the output of amplifier 142 causes shift register 132 to be incremented so that a binary one is loaded in stage three thereof, to the exclusion of the remaining stages. In response to the binary zero to one transition of stage three of shift register 132, flip-flop 133.3 is activated to the set state, to the exclusion of flip-flops 133.1, 133.2 and 133.4–133.48. This causes output stage 34.3 to be activated to a fully conducting state, to the exclusion of the remaining stages 34.1, 34.2 and 34.4–34.48.

The outputs of analog adders 121 and 125 and the states of ring modulator 127 and stages 34.1–34.8 remain in this condition until the voltage of triangle wave source 71 again drops below minus 40 millivolts. In response to the voltage of source 71 dropping below minus 40 millivolts, a positive going transition occurs at the output of comparator 141 of comparator 126, causing shift register 131 to be incremented so that stage three thereof is in a binary one state, to the exclusion of the remaining stages of shift register 131. The binary zero to one transition in stage three of shift register 131 causes flip-flop 133.3 to be switched back to the reset state, causing output stage 34.3 to revert to the non-sourced state. The output of analog adder 125 thereby drops to a zero state. Because the input voltages of comparator 126 are equal, there is no change in the comparator output.

From the foregoing, it is seen that the sum of the output voltages of stages 34.1–34.3, at the input of filter 21, has transitions between zero and 600 volts in response to the stated transitions of triangular wave source 71. The time between these transitions is controlled by the amplitude of source 18. However, stages 34.2 and 34.3 are activated into the conducting state at different times in response to the variations of triangular wave source 71. Thereby, the substantial power which is dissipated in output stages 34.2 and 34.3 is shared by these stages.

As long as the voltage of AC modulation source 18 remains constant at the 0.04 volt level only one of output stages 34.1–34.48 is activated into the conducting state at a time. However, all of stages 34.1–34.48 are sequentially activated in the conducting state, at a frequency determined by the frequency of source 71. The switching frequency of a particular output stage 34 is basically equal to the frequency of source 71 divided by the number of output stages; typically the switching frequency is about 2 kHz, so that switching losses in each output stage are relatively low. As the voltage of source 18 varies, the number of output stages 34 in a conducting state varies accordingly. Which of output stages 34 are in a conducting state is thus a function of present and prior values of AC modulation source 18.

In virtually all instances, except for the very low voltage situation of source 18 described in the foregoing example, the difference in the number of stages of shift registers 131 and 132 which are loaded with binary one levels is in excess of one. This causes more than one of latches 133.1–133.48 to be activated into the binary one state at a time. Consequently, more than one of output stages 34.1–34.48 is usually activated simultaneously into a conducting state.

To continue with the foregoing example, assume that time has progressed so that stages three and four of shift registers 131 and 132 are respectively loaded with binary ones at the instant while the voltage of source 18 increases from 40 millivolts to 120 millivolts. Also assume that at this particular instant the voltage of triangle wave source 71 is in excess of 20 millivolts. Under these conditions, binary one levels are derived from comparators 109.1 and 109.2, causing a 200 millivolt signal to be supplied by analog adder 121 to one input of comparator 126. Simultaneously, the other input of comparator 126 is responsive to a 100 millivolt signal resulting from latch 133.4 being in a binary one state. Comparator 126 responds to the resulting differential input thereof to increment shift register 132 so that the binary one state is in stage five of the shift register.

The binary zero to one transition in stage five of shift register 132 causes flip-flop 133.5 to be activated to the set condition. Simultaneously, flip-flop 133.4 is in the set condition. Because flip-flops 133.4 and 133.5 are both in the set state, output stages 34.4 and 34.5 are in a conducting state. Thereby, a voltage of 1200 volts is derived from output stages 34.1–34.48 in response to the increase of source 18 from 40 millivolts to 120 millivolts.

The outputs of adders 121 and 125, comparator 126 and ring modulator 127 remain in these states until the voltage of triangle wave source 71 drops below minus 20 millivolts, assuming that the voltage of source 18 remains at 120 millivolts. In response to the voltage of source 71 dropping below minus 20 millivolts, the voltage of analog adder 121 drops to 100 millivolts, causing a positive going transition to be derived from comparator 141 of comparator network 126. The positive going transition in the output of comparator 141 increments shift register 131 so that a binary one is derived from stage four thereof. Flip-flop 133.4 is thereby reset, with a consequent change in state of output stage 34.4 from a conducting to a non-conducting state; stage 34.5 is the only conducting output stage.

This state of stages 34 remains until the voltage of source 71 increases above minus 20 millivolts, at which time a positive going transition in the output of comparator 142 causes shift register 132 to be incremented so that a binary one is loaded in stage six thereof. Consequently, flip-flop 133.6 is set. Since flip-flop 133.5 remains in the set state, output stages 34.5 and 34.6 are simultaneously conducting. Hence, the cumulative output voltage of stages 34.1–34,8 increases to 1200 volts. The current supplied to the load has been transferred from stages 34.4 and 34.5 to stages 34.5 and 34.6 while providing the pulse width modulation function. Thereby the power dissipation of two output stages is shared amongst stages 34.4–34.6. If the voltage of source 18 remains constant at the 120 millivolt level, two of stages 34 are conducting 80% of the time, one of stages 34 is conducting 20% of the time, and there is a periodic sequential shifting of the conducting output stages from stage to stage in an advancing manner. Thereby, dissipation in the various output stages has a tendency to be equalized and transferred from stage to stage.

While there have been described and illustrated several specific embodiments of the invention, it will be clear that variations in the details of the embodiments specifically illustrated and described may be made without departing from the true spirit and scope of the invention as defined in the appended claims. For example the power amplifier of the present invention can be used for purposes other than for radio transmitters. Also, triangular wave source 71 can be eliminated from the circuit of FIGS. 3 and 4 if the accompanying higher distortion is tolerable.

We claim:

1. A power amplifier responsive to an analog source comprising plural switching stages each powered by a DC source, each of said stages being switched from a non-sourced state to a fully conducting state in response to the amplitude of the analog source exceeding a threshold amplitude for the stage, each of the stages having a different threshold, each of the stages having a pair of output terminals, the output terminals of each stage being coupled with and decoupled from the DC source for the particular stage while the particular stage is respectively in the fully conducting and non-sourced states so that a response derived between the output terminals of each stage is either at only a substantially zero amplitude or a predetermined amplitude, said thresholds and analog source being arranged so that the responses derived between the output terminals of said stages change between the zero and predetermined amplitudes as the amplitude of the analog source changes relative to the thresholds of the different stages, the output terminals of the different stages being connected together so that the responses of the different stages are summed together, and means for continuously varying the amplitude of the threshold by a small amount relative to a predetermined maximum amplitude for the analog source.

2. The power amplifier of claim 1 wherein the means for varying includes a source of a wave having a constantly changing amplitude.

3. The power amplifier of claim 2 wherein the wave has a fixed frequency.

4. The power amplifier of claim 2 wherein the wave has a linear variation as a function of time.

5. The power amplifier of claim 2 wherein the wave has a variable frequency dependent on a parameter of the analog source.

6. The power amplifier of claim 5 wherein the wave has a linear variation as a function of time.

7. The power amplifier of claim 5 wherein the parameter is amplitude.

8. The power amplifier of claim 5 wherein the parameter is frequency.

9. The power amplifier of claim 5 wherein the wave has a variable frequency dependent on the amplitude and frequency of the analog source.

10. The power amplifier of claim 2 wherein a controller for each stage includes means for linearly combining the analog source, the wave and a reference amplitude determined by the threshold of the controller for the particular stage.

11. The power amplifier of claim 2 wherein the wave has a minimum frequency equal to at least twice the frequency of the analog source.

12. The power amplifier of claim 2 wherein the wave has a maximum amplitude equal to the amplitude between adjacent thresholds, adjacent thresholds being spaced in amplitude by approximately the same amount.

13. The power amplifier of claim 2 wherein the wave has a maximum amplitude equal to twice the amplitude between adjacent thresholds, adjacent thresholds being spaced in amplitude by approximately the same amount.

14. The power amplifier of claim 2 wherein the thresholds for the plural switching stages are derived by a control circuit, the control circuit for the stages being responsive to DC reference voltages derived from a voltage divider connected across terminals of a DC supply, the voltage divider including at least several taps, a comparator responsive to the linear combination of (a) the analog source, (b) the wave having a constantly changing value and (c) a constant maximum value at a reference amplitude controlled by the voltages at the taps, the comparator deriving an output signal having transitions as a function of the amplitudes of (a) the analog source, (b) the wave having a constantly changing value and the reference amplitude, the output signal controlling the stage conducting state.

15. The power amplifier of claim 1 further including means for from time to time changing the threshold of different ones of said stages so that at different times different ones of the stages are in the non-sourced and conducting states for the same amplitude of the analog source and the same summed response is derived for the same amplitude of the modulating source.

16. The power amplifier of claim 1 wherein each of said stages includes a solid state switch having input and output electrodes in series with the DC source, and means for controlling the on and off conduction properties of the switch, said solid state switch being activated to a saturated state while the stage associated therewith is fully conducting.

17. The power amplifier of claim 1 wherein the DC source powering each stage includes an isolated AC-DC converter.

18. The power amplifier of claim 17 wherein the AC-DC converter for each stage includes a multi-phase transformer secondary winding, the secondary windings associated with a plurality of said stages being coupled to a single multiphase primary winding, the primary and secondary windings being coupled to each other so that the current and voltages in each stage result in a power factor of approximately unity while each stage is in a conducting state.

19. The power amplifier of claim 18 wherein a plurality of said transformers are included, different ones of said transformers being connected to power different ones of said stages.

20. The power amplifier of claim 1 wherein the response of each stage is an output voltage, the output having a-n approximately zero voltage and low impedance while the stage is non-sourced and a predetermined non-zero voltage while the stage is fully conducting, the output voltages of the different stages being stacked to derive the summed response.

21. The power amplifier of claim 20 wherein each stage includes an AC to DC converter responsive to an isolated AC source and a series switch driven to a non-sourced state and a saturated state while the stage is respectively non-sourced and fully conducting.

22. The power amplifier of claim 21 wherein the output terminals of each stage are shunted by a diode, the diode being back biased while the stage is conducting and being forward biased while the stage is non-sourced.

23. The power amplifier of claim 21 wherein a separate control circuit is provided for the switch of each stage, each of said control circuits including an optical link for a control electrode of the switch of the respective stage.

24. The power amplifier of claim 23 wherein the control circuit for each stage is responsive to a DC reference voltage derived from a voltage divider connected across terminals of a DC supply, the voltage divider including at least several taps, each of said taps being connected to a different one of the control circuits to derive the threshold for each stage.

25. The power amplifier of claim 24 wherein each control circuit includes a comparator responsive to the linear combination of the analog source, a wave having a constantly changing value and a constant maximum value at a reference amplitude controlled by the voltages at the taps, the comparator deriving an output signal having transitions as a function of the amplitudes of the analog source, the wave having the constantly changing value and reference amplitude for each stage, the output signal controlling the switch conducting state.

26. The power amplifier of claim 1 wherein the thresholds for the plural switching stages are derived by a control circuit, the control circuit for the stages being responsive to DC reference voltages derived from a voltage divider connected across terminals of a DC supply, the voltage divider including at least several taps, the voltage at each of the taps being related to the threshold for each stage.

27. A power amplifier responsive to an analog source comprising plural switching stages each powered by a DC source, each of said stages being switched from a non-sourced state to a fully conducting state in response to the amplitude of the analog source exceeding a threshold amplitude for the stage, each of the stages having a different threshold, each of the stages having a pair of output terminals, the output terminals of each stage being coupled with and decoupled from the DC source for the particular stage while the particular stage is respectively in the fully conducting and non-sourced states so that a response derived between the output terminals of each stage is either at only a substantially zero amplitude or a predetermined amplitude, said thresholds and analog source being arranged so that the responses derived between the output terminals of said stages change between the zero and predetermined amplitudes as the amplitude of the analog source changes relative to the thresholds of the different stages, the output terminals of the different stages being connected together so that the responses of the different stages are summed together, and means for from time to time changing the threshold of different ones of said stages effectively so that a (a) different times different ones of the stages are in the nonsourced and conducting states for the same amplitude of the modulating source, (b) the same summed response is derived for the same amplitude of the modulating source and (c) the stage which has been conducting the longest is non-sourced and the stage which has been non-sourced the longest is activated to a conducting state in response to the amplitude of the analog source changing relative to the thresholds.

28. The power amplifier of claim 27 wherein the means for changing causes the stages to be activated so that stages N(p) through N(q) are all in a first of said states and the rest of the stages are in a second of said states and the values of N(p) and N(q) both always change in the same direction except while transitions occur between the first and last of said stages.

29. The power amplifier of claim 27 wherein the means for changing includes: first and second recirculating multi-stage shift registers, and means for changing the stages of the shift registers in a binary one state as a function of the number of output stages in one of said states relative to a set point value therefor derived in response to the amplitude of the analog source.

30. The power amplifier of claim 29 wherein the means for changing includes plural latches, each of said latches connected to control the conducting state of a respective one of said output stages, said latches being connected to be responsive to the binary states of the stages of the shift registers so that the latches are respectively activated to first and second states in response to corresponding stages of the first and second shift registers having binary one values loaded therein.

31. The power amplifier of claim 27 wherein the threshold is continuously varied in response to a linear combination of the amplitude of the analog source and a continuously time varying function having a small amplitude relative to a predetermined maximum amplitude of the analog source.

32. The power amplifier of claim 31 wherein the time varying function has an amplitude that is a linear function of time.

33. The power amplifier of claim 32 wherein the frequency of the linear function changes in response to variations of the analog source.

34. The power amplifier of claim 32 wherein the frequency of the linear function changes in response to the frequency of the analog source.

35. The power amplifier of claim 32 wherein the frequency of the linear function changes in response to the amplitude of the analog source.

36. The power amplifier of claim 32 wherein the frequency of the linear function changes in response to the amplitude and frequency of the analog source.

37. An AM transmitter responsive to a modulating source and a carrier source comprising a transmitter output stage having: a control electrode responsive to the carrier source, an output electrode coupled to a power amplifier responsive to the modulating source, and means for coupling the output electrode to an antenna, the power amplifier including: a plurality of switching stages each powered by a DC source, each of said switching stages being switched from a non-sourced state to a fully conducting state in response to the amplitude of the modulating source exceeding a threshold amplitude for the stage, each of the stages having a different threshold, each of the stages having a pair of output terminals, the output terminals of each stage being coupled with and decoupled from the DC source for the particular stage while the particular stage is respectively in the fully conducting and non-sourced states so that a voltage derived between the output terminals of each stage is either at only a substantially zero amplitude or a predetermined amplitude, said thresholds and modulating source being arranged so that the voltages derived between the output terminals of said stages change between the zero and predetermined amplitudes as the amplitude of the modulating source changes relative to the thresholds of the different stages, the output terminals of the different stages being connected together so that the voltages of the different stages are summed together, and means for continuously varying the threshold of said stages by a small amount relative to a predetermined maximum amplitude of the modulating source; and means for applying the summed voltages to a power supply terminal for the output electrode.

38. The transmitter of claim 37 wherein the means for applying includes a low pass filter.

39. The transmitter of claim 37 wherein the means for continuously varying includes a source of a wave having a constantly changing amplitude, the wave having a constant maximum amplitude having a small value compared to the predetermined maximum value of the modulating source.

40. The transmitter of claim 39 wherein the wave has a linear variation as a function of time.

41. The transmitter of claim 39 wherein the wave has a variable frequency dependent on a parameter of the analog source.

42. The transmitter of claim 41 wherein the wave has a linear variation as a function of time.

43. The transmitter of claim 41 wherein the parameter is amplitude.

44. The transmitter of claim 41 wherein the parameter is frequency.

45. The transmitter of claim 41 wherein the wave has a variable frequency dependent on the amplitude and frequency of the analog source.

46. The transmitter of claim 37 further including means for from time to time changing the threshold of different ones of said switching stages so that at different times different ones of the switching stages are in the non-sourced and conducting states for the same amplitude of the analog source and the same summed response is derived for the same amplitude of the modulating source.

47. A method of operating a power amplifier responsive to an analog source, the power amplifier including multiple output stages activated only to non-sourced and conducting states, responses from the multiple stages being summed together to derive a wave that is a step wise replica of the analog source, the method comprising activating the stages so that (a) the number of stages in the conducting state is proportional to the amplitude of the analog source (b) at different times different ones of the stages are in the non-sourced and conducting states for a constant amplitude of the analog source and (c) the stage which has been conducting the longest is non-sourced and the stage which has been nonsourced the longest is activated to a conducting state in response to changes in the amplitude of the analog source.

48. The method of claim 47 wherein the activating step includes activating the stages so that: (a) stages $N(p)$ through $N(q)$ are all in a first of said states, (b) the rest of the stages are in a second of said states and (c) the values of $N(p)$ and $N(q)$ both always change in the same direction except while transitions occur between the first and last of said stages.

49. A power amplifier responsive to an analog source comprising multiple output stages activated only to nonsoruced and conducting states, responses from the multiple stages being summed together to derive an output wave, and means responsive to the source for activating the stages so that: (a) the number of stages in the conducting state is proportional to the amplitude of the analog source, (b) at different times different ones of the stages are in the non-sourced and conducting states for a constant amplitude of the analog source and (c) the stage which has been conducting the longest is non-sourced and the stage which has been non-sourced the longest is activated to a conducting state in response to changes in the amplitude of the analog source.

50. The power amplifier of claim 49 wherein the means for activating the stages causes all of stages $N(p)$ through $N(q)$ to be in a first of said states and the rest of the stages are in a second of said states and the values of $N(p)$ and $N(q)$ both always change in the same direction except while transitions occur between the first and last of said stages.

51. The power amplifier of claim 50 wherein the means for activating includes plural latches, each of said latches being connected to control the conducting state of a respective one of said output stages, said latches being connected to be responsive to the binary states of the stages of the shift registers so that the latches are respectively activated to first and second states in response to corresponding stages of the first and second shift registers having binary one values loaded therein.

52. The power amplifier of claim 49 wherein the means for activating includes: first and second recirculating multi-stage shift registers, and means for changing the stages of the shift registers in a binary one state as a function of the number of output stages in one of said states relative to a set point value therefor derived in response to the amplitude of the analog source.

53. The power amplifier of claim 52 wherein the set point value is continuously varied in response to a linear combination of the amplitude of the analog source and a continuously time varying function having a small amplitude relative to a predetermined maximum amplitude of the analog source.

54. The power amplifier of claim 53 wherein the time varying function has an amplitude that is a linear function of time.

55. The power amplifier of claim 54 wherein the frequency of the linear function changes in response to variations of the analog source.

56. The power amplifier of claim 54 wherein the frequency of the linear function changes in response to the frequency of the analog source.

57. The power amplifier of claim 54 wherein the frequency of the linear function changes in response to the amplitude of the analog source.

58. The power amplifier of claim 54 wherein the frequency of the linear function changes in response to the amplitude and frequency of the analog source.

59. The power amplifier of claim 54 wherein the frequency of the linear function changes in response to an RMS like function and frequency of the analog source.

60. A method of operating a power amplifier responsive to an analog source, the power amplifier including multiple output stages activated only to non-sourced and conducting states, responses from the multiple stages being summed together to derive a wave that is a step wise replica of the analog source, the method comprising activating the stages so that the number of stages in the conducting state is proportional to the linear combination of the amplitude of the analog source and a continuously varying function having a small maximum amplitude relative to a predetermined maximum amplitude of the analog source.

61. The method of claim 60 further including controlling the continuously varying function so it has an amplitude that is a linear function of time.

62. The method of claim 61 further including controlling the frequency of the linear function so it changes in response to variations of the analog source.

63. The method of claim 62 further including controlling the frequency of the linear function so it changes in response to the frequency of the analog source.

64. The method of claim 62 further including controlling the frequency of the linear function so it changes in response to the amplitude of the analog source.

65. The method of claim 62 further including controlling the frequency of the linear function so it changes in response to the amplitude and frequency of the analog source.

66. The method of claim 62 further including controlling the frequency of the linear function so it changes in response to an RMS like function and frequency of the analog source.

67. A power amplifier responsive to an analog source comprising multiple output stages activated only to non-sourced and conducting states, responses from the multiple stages being summed together to derive an output wave, and means responsive to the source for activating the stages so that the number of stages in the conducting state is proportional to the linear combination of the amplitude of the analog source and a continuously varying function having a small maximum amplitude relative to a predetermined maximum amplitude of the analog source.

68. The power amplifier of claim 67 wherein the continuously varying function has an amplitude that is a linear function of time.

69. The power amplifier of claim 68 wherein the frequency of the linear function changes in response to variations of the analog source.

70. The power amplifier of claim 69 wherein the frequency of the linear function changes in response to the frequency of the analog source.

71. The power amplifier of claim 69 wherein the frequency of the linear function changes in response to the amplitude of the analog source.

72. The power amplifier of claim 69 wherein the frequency of the linear function changes in response to the amplitude and frequency of the analog source.

73. The power amplifier of claim 69 wherein the frequency of the linear function changes in response to an RMS like function and frequency of the analog source.

74. A method of operating a power amplifier responsive to an analog source having a variable amplitude N+k, the power amplifier including multiple output stages activated only to non-sourced and conducting states, responses from the multiple stages being summed together to derive a wave that is a step wise replica of the analog source, the method comprising activating the stages so that the number of stages in the conducting state is proportional to N and at least one of the stages is pulse width modulated, the duty cycle of the pulse width modulation being proportional to k so that the average value of the summed responses over one cycle of the pulse width modulation is proportional to N+k.

75. The method of claim 74 further comprising activating the stages so that the stages in the conducting state are continuously shifted even though the amplitude of the source remains constant.

76. A power amplifier responsive to an analog source having a variable amplitude N+k comprising multiple output stages activated only to non-sourced and conducting states, responses from the multiple stages being summed together to derive an output wave, and means responsive to the source for activating the stages so that the number of stages in the conducting state is proportional to N and at least one of the stages is pulse width modulated, the duty cycle of the pulse width modulation being proportional to k so that the average value of the summed responses over one cycle of the pulse width modulation is proportional to N+k.

77. The power amplifier of claim 76 wherein the means for activating activates the stages so that the stages in the conducting state are continuously shifted even though the amplitude of the source remains constant.

78. An amplifier responsive to a source comprising at least several stages activated only to one of two bi-level states controlled in response to the value of the source exceeding a threshold for each stage, each stage having a different threshold, said thresholds and source being arranged so that the stages change between said bi-level states as the value of the source changes relative to the thresholds o the different stages, bi-level outputs associated with the bi-level states of the plural stages being summed together, and means for continuously varying the values of the thresholds by a small amount relative to a predetermined maximum value for the source.

79. The amplifier of claim 78 wherein the thresholds of different ones of said stages are changed so that at different times different ones of the stages are in first and second of said states even though there is no change in value of the source and the same sum is derived for the same value of the source.

80. The amplifier of claim 78 wherein the thresholds for the plural stages are derived by a control circuit responsive to DC reference voltages derived form a voltage divider connected across terminals of a DC supply, the voltage divider including at least several taps, the voltage at each of the taps being related to the threshold for each stage.

81. The amplifier of claim 78 wherein the thresholds for the plural stages are derived by a control circuit responsive to DC reference voltages derived from a voltage divider connected across terminals of a DC supply, the voltage divider including at least several taps, each stage including a comparator responsive to the combination of (a) the source, (b) the amplitude of a signal representing the varying value and (c) a reference value controlled by the voltages at the taps for deriving an output signal having transitions for controlling the stage conducting state.

82. The amplifier of claim 78 wherein the amplifier is a power amplifier and the stages are power output stages of the power amplifier.

83. The amplifier of claim 78 wherein the amplifier is included in a control circuit for power output stages of a power amplifier, the power output stages being activated only to sourced and unsourced states, and means for controlling which of and for how long the power output stages are in the sourced and unsourced states in response to the sum of the outputs of the stages of the control circuit.

84. The amplifier of claim 83 wherein the means for controlling activates the output stages so that different ones of the output stages are sourced and unsourced for the same value of the source.

85. The amplifier of claim 83 wherein the means for controlling activates the output stages so that different ones of the output stages are sourced and unsourced at different times even though there is no change in value of the source.

86. The amplifier of claim 78 wherein the means for varying includes a source of a signal having a constantly changing value.

87. The amplifier of claim 86 wherein the signal having the constantly changing value has a fixed frequency.

88. The amplifier of claim 87 wherein the signal having a constantly changing value represents a wave having a variable frequency dependent on a parameter of the source.

89. The amplifier of claim 88 wherein the parameter is amplitude.

90. The amplifier of claim 88 wherein the parameter is frequency.

91. The amplifier of claim 88 wherein the signal having a constantly changing value represents a wave having a variable frequency dependent on the amplitude and frequency of the source.

92. The amplifier of claim 86 wherein the signal having a constantly changing value represents a wave having a linear variation as a function of time.

93. An amplifier responsive to a source susceptible of having changing values as a function of time comprising at least several stages activated only to one of two bi-level states controlled in response to the value of the source exceeding a threshold for each stage, said thresholds and source being arranged so that the stages change between said bi-level states as the value of the source changes relative to the thresholds of the different stages, bi-level outputs associated with the bilevel states of the stages being summed together, and means for continuously varying the value of the thresholds relative to a median threshold by an amount that is a function of the value of the source.

94. The amplifier of claim 93 wherein each of said stages has a different median threshold so that the state of each stage changes as the value of the source changes relative to the threshold for the stage.

95. The amplifier of claim 93 wherein the thresholds for the several stages are derived by a control circuit responsive to DC reference voltages derived from a voltage divider connected across terminals of a DC supply, the voltage divider including at least several taps, the voltage at each of the taps being related to the threshold for each stage.

96. The amplifier of claim 93 wherein the thresholds for the several stages are derived by a control circuit responsive to DC reference voltages derived from a voltage divider connected across terminals of a DC supply, the voltage divider including at least several taps, each stage including a comparator responsive to the combination of (a) the source, (b) the value of a wave representing the continuously varying value and (c) a reference value controlled by the voltages at the taps for deriving an output signal having transitions for controlling the stage conducting state.

97. The amplifier of claim 93 wherein the amplifier is a power amplifier and the stages are power output stages of the power amplifier.

98. The amplifier of claim 93 wherein the amplifier is included in a control circuit for power output stages of a power amplifier, the power output stages being activated only to sourced and unsourced states, and means for controlling which of and for how long the power output stages are in the sourced and unsourced states in response to the sum of the outputs of the stages of the control circuit.

99. The amplifier of claim 93 wherein the means for varying includes a source of a signal having a constantly changing value.

100. The amplifier of claim 99 wherein the constantly changing value represents a wave having a fixed frequency.

101. The amplifier of claim 99 wherein the signal having the constantly changing value represents a wave having a variable frequency dependent on a parameter of the source.

102. The amplifier of claim 101 wherein the parameter is amplitude.

103. The amplifier of claim 101 wherein the parameter is frequency.

104. The amplifier of claim 101 wherein the signal having the constantly changing value represents a wave having a variable frequency dependent on the amplitude and frequency of the source.

105. The amplifier of claim 99 wherein the signal having a constantly changing value represents a wave having a linear variation as a function of time.

106. An amplifier responsive to a source having a value N+k susceptible of having changing values as a function of time comprising at least several stages activated only to one of two different bi-level states, bi-level outputs associated with the bi-level states of the stages being summed together to derive a summed response, and means responsive to the source for activating the stages so that the number of stages in one of said states is proportional to N and at least one of the stages is pulse width modulated, the duty cycle of the pulse width modulation being proportional to k so that the average value of the summed responses over one cycle of the pulse width modulation is proportional to $N+k$, any one of said stages being susceptible of pulse width modulation proportional to k.

107. The amplifier of claim 106 wherein each of said stages has a different median threshold so that the state of each stage changes as the value of the source changes relative to the threshold for the stage.

108. The amplifier of claim 107 further including means for continuously varying the threshold of each stage by a small amount relative to a predetermined maximum value for the source.

109. The amplifier of claims 7 wherein the thresholds for the several stages are derived by a control circuit responsive to DC reference voltages derived from a voltage divider connected across terminals of a DC supply, the voltage divider including at least several taps, the voltage at each of the taps being related to the threshold for each stage.

110. The amplifier of claims 7 wherein the thresholds for the several stages are derived by a control circuit responsive to DC reference voltages derived form a voltage divider connected across terminals of a DC supply, the voltage divider including at least several taps, each stage including a comparator responsive to the combination of (a) the source, (b) the value of a signal representing a wave having a continuously varying value and (c) a reference value controlled by the voltages at the taps for deriving an output signal having transitions for controlling the stage conducting state.

111. The amplifier of claim 106 wherein the amplifier is a power amplifier and the stages are power output stages of the power amplifier.

112. The amplifier of claim 106 wherein the amplifier is included in a control circuit for power output stages of a power amplifier, the power output stages being activated only to sourced and unsourced states, and means for controlling which of and for how long the power output stages are in the sourced and unsourced states in response to the sum of the outputs of the stages of the control circuit.

113. The amplifier of claim 106 wherein the means for activating includes a source of a signal representing a wave having a constantly changing value.

114. The amplifier of claim 113 wherein the signal represents a constantly changing amplitude wave having a variable frequency dependent on a parameter of the source.

115. The amplifier of claim 114 wherein the parameter is amplitude.

116. The amplifier of claim 114 wherein the parameter is frequency.

117. The amplifier of claim 114 wherein the signal represents a constantly changing amplitude wave having a variable frequency dependent on the amplitude and frequency of the source.

118. An amplifier responsive to a source susceptible of having changing values as a function of time comprising at least several stages activated only to one of two different bi-level states, bi-level outputs associated with the bi-level states of the stages being summed together to derive a summed response that is a stepwise function of the source, and means responsive to the source for activating the stages so that the number of stages in one of said states is commensurate with the combination of the value of the source and a continuously varying signal always having a small value relative to a predetermined maximum value of the source.

119. The amplifier of claim 118 wherein each of said stages has a different median threshold so that the state of each stage changes as the value of the source changes relative to the threshold for the stage.

120. The amplifier of claim 119 wherein the thresholds of different ones of said stages are changed so that at different times different ones of the stages are in first and second of said states even though there is no change in value of the source and the same sum is derived for the same value of the source.

121. The amplifier of claim 119 wherein the thresholds for the plural stages are derived by a control circuit responsive to DC reference voltages derived from a voltage divider connected across terminals of a DC supply, the voltage divider including at least several taps, the voltage at each of the taps being related to the threshold for each stage.

122. The amplifier of claim 118 wherein the amplifier is a power amplifier and the stages are power output stages of the power amplifier.

123. The amplifier of claim 118 wherein the amplifier is included in a control circuit for power output stages of a power amplifier, the power output stages being activated only to sourced and unsourced states, and means for controlling which of and for how long the power output stages are in the sourced and unsourced states in response to the sum of the outputs of the stages of the control circuit.

124. The amplifier of claim 118 wherein the continuously varying signal has a variable frequency dependent on a parameter of the analog source.

125. The amplifier of claim 124 wherein the parameter is amplitude.

126. The amplifier of claim 124 wherein the parameter is frequency.

127. The amplifier of claim 124 wherein the continuously varying signal has a variable frequency dependent on the amplitude and frequency of the analog source.

128. An amplifier responsive to a source susceptible of having changing values as a function of time comprising at least several stages activated only to one of two different bi-level states, bi-level outputs associated with the bi-level states of the stages being summed together to derive a summed response that is a stepwise function of the source, means responsive to the value of the source for deriving first and second commands respectively indicating that the number of stages in one of said states is to increase and decrease, and means responsive to the commands for increasing and decreasing the number of stages in first and second of said states so that the stage which has been in the first state the longest is activated to the second state in response to the second command and the stage which has been in the second state the longest is activated to the first state in response to the first command and for causing different ones of said stages to be in the first state and different ones of said stages to be in the second state at different times even though there is no change in value of the source.

129. An amplifier responsive to a source susceptible of having changing values as a function of time comprising at least several stages activated only to one of two different bi-level states, bi-level outputs associated with the bi-level states of the stages being summed together to derive a summed response that is a stepwise function of the source, and means responsive to the source for deriving a first indication of the number of stages that should be in a first of said states and a second indication of the number of stages actually in said first state, and means responsive to a comparison of the first and second indications for controlling the length of time each of said stages is in said first state and the number of said stages in said first state, said control means including means for storing a value commensurate with the number of stages in the one bi-level state, the value stored by the storing means being changed in response to the comparison indicating that the first indication exceeds the second indication and the second indication exceeds the first indication.

130. The amplifier of claim 129 wherein said means for controlling causes different ones of said stages to be in the first state and different ones of said stages to be in a second of said states at different times even though there is no change in the value of the source.

131. The amplifier of claim 129 wherein the means for deriving the first indication includes plural input elements having only bi-level outputs controlled in response to the value of the source exceeding a threshold for each input element, each input element having a different threshold, said thresholds and source being arranged so that outputs of the input elements change between said bi-level outputs as the value of the source changes relative to the thresholds of the different input stages, the outputs of the input elements being summed together.

132. The amplifier of claim 131 further including means for continuously varying the value of the threshold by a small amount relative to a predetermined maximum value for the source.

133. The amplifier of claim 132 wherein the means for controlling the length of time includes means responsive to the comparison for increasing and decreasing the number of stages in the first state.

134. The amplifier of claim 129 wherein the storing means includes a ring modulator having plural stages, the ring modulator including a pair of shift registers, each shift register having an increment input and plural states, each associated with one of the at least several stages, one of the increment inputs being responsive to a signal indicating that the first indication exceeds the second indication, the other increment input being responsive to a signal indicating that the second indication exceeds the first indication.

* * * * *

UNITED STATES PATENT AND TRADEMARK OFFICE
CERTIFICATE OF CORRECTION

PATENT NO. : 5,099,203
DATED : March 24, 1992
INVENTOR(S) : Bryan A. WEAVER et al It is certified that error appears in the above-indentified patent and that said Letters Patent is hereby corrected as shown below:

In Column 5, line 55, before "maximum" insert --positive--;

In Column 10, line 6, change "threephase" to --three-phase--;

In Column 10, change "isolated" to --insulated--;

In Column 10, line 13, change "emittercollector" to --emitter-collector--;

In Column 10, line 21, change "a-n" to --an--;

In Column 20, claim 27, line 23, change "a (a)" to --(a) at--;

In Column 22, claim 49, line 3, change "nonsoruced" to --non-sourced--;

In Column 24, claim 78, line 58, change "othe" to --of the--;

In Column 27, claim 109, line 13, change "claims 7" to --claim 107--;

In Column 27, claim 110, line 20, change "claims 7" to --claim 107--;

UNITED STATES PATENT AND TRADEMARK OFFICE
CERTIFICATE OF CORRECTION

PATENT NO. : 5,099,203
DATED : March 24, 1992
INVENTOR(S) : Bryan A. WEAVER et al It is certified that error appears in the above-indentified patent and that said Letters Patent is hereby corrected as shown below:

In Column 27, claim 110, line 22, change "form" to --from--.

Signed and Sealed this

Twenty-first Day of March, 1995

Attest:

BRUCE LEHMAN

Attesting Officer  Commissioner of Patents and Trademarks